(12) United States Patent
Hwang et al.

(10) Patent No.: US 10,222,667 B2
(45) Date of Patent: Mar. 5, 2019

(54) DISPLAY APPARATUS

(71) Applicant: Samsung Display Co., Ltd., Yongin, Gyeonggi-Do (KR)

(72) Inventors: Seong-Yong Hwang, Yongin-si (KR); An-Na Park, Yongin-si (KR); Weon-Sik Oh, Osan-si (KR); Jin-Kwan Kim, Suwon-si (KR); Sung-Lak Choi, Osan-si (KR); Kyung-Lae Rho, Suwon-si (KR); Hyo-Hwi Choi, Suwon-si (KR); Ju-Yong Kim, Suwon-si (KR); Dong-Ha Lee, Changwon-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 78 days.

(21) Appl. No.: 14/026,183

(22) Filed: Sep. 13, 2013

(65) Prior Publication Data
US 2014/0014981 A1    Jan. 16, 2014

Related U.S. Application Data

(63) Continuation of application No. 11/159,098, filed on Jun. 23, 2005.

(30) Foreign Application Priority Data

Jun. 23, 2004 (KR) .................... 10-2004-0046930

(51) Int. Cl.
*G09G 3/36* (2006.01)
*G02F 1/1362* (2006.01)
*G02F 1/1345* (2006.01)
*H05K 3/36* (2006.01)
*H05K 3/32* (2006.01)

(52) U.S. Cl.
CPC .... G02F 1/136286 (2013.01); G02F 1/13452 (2013.01); H05K 3/361 (2013.01); *G02F 2202/28* (2013.01); *G09G 3/3648* (2013.01); *H05K 3/323* (2013.01); *H05K 2201/0969* (2013.01); *H05K 2201/09663* (2013.01)

(58) Field of Classification Search
CPC ........... G02F 1/13452; G02F 1/136286; G02F 2202/28; H05K 3/361; H05K 2201/09663; H05K 2201/0969; H05K 3/323; G09G 3/3648
USPC ......... 345/87–104; 349/37–187; 257/72, 787
See application file for complete search history.

(56) References Cited

U.S. PATENT DOCUMENTS 4,902,103 A * 2/1990 Miyake ............ G02F 1/133514
                                                    349/108
5,016,986 A * 5/1991 Kawashima et al. ......... 349/138
(Continued)

FOREIGN PATENT DOCUMENTS

JP      11-002830 A      1/1999
KR    1999-0042507 A    6/1999

*Primary Examiner* — Vinh T Lam
(74) *Attorney, Agent, or Firm* — Cantor Colburn LLP

(57) ABSTRACT

A display apparatus including a display panel including a pixel electrode and a plurality of first signal lines transmitting a driving signal to the pixel electrode, a conductive member on the first signal lines, the conductive member having a resin, and a second signal line on the conductive member, the second signal line having an opening through which the resin travels to couple the second signal line with one of the first signal lines.

39 Claims, 6 Drawing Sheets

(56) References Cited

U.S. PATENT DOCUMENTS

| | | | | |
|---|---|---|---|---|
| 5,592,199 A | * | 1/1997 | Kawaguchi et al. | 345/206 |
| 5,598,283 A | * | 1/1997 | Fujii | G02F 1/1345 349/143 |
| 5,619,358 A | * | 4/1997 | Tanaka | G02F 1/1345 349/143 |
| 5,729,316 A | * | 3/1998 | Yamamura | G02F 1/13452 349/149 |
| 5,731,854 A | * | 3/1998 | Kishida | G02F 1/136204 349/149 |
| 5,777,610 A | * | 7/1998 | Sugimoto | H05K 1/147 345/206 |
| 5,790,220 A | * | 8/1998 | Sakamoto | G02F 1/13452 257/E23.002 |
| 5,949,502 A | * | 9/1999 | Matsunaga | G02F 1/136204 349/40 |
| 6,111,628 A | * | 8/2000 | Shiota | G02F 1/13452 257/E21.511 |
| 6,169,530 B1 | * | 1/2001 | Mori | G02F 1/13452 345/100 |
| 6,198,522 B1 | * | 3/2001 | Yanagi | G02F 1/13452 349/139 |
| 6,262,702 B1 | * | 7/2001 | Murade | G02F 1/1345 345/100 |
| 6,281,959 B1 | * | 8/2001 | Kim et al. | 349/152 |
| 6,362,866 B1 | * | 3/2002 | Yamazaki | G02F 1/13452 349/149 |
| 6,366,331 B1 | * | 4/2002 | Sakamoto | G02F 1/13452 349/149 |
| 6,388,339 B1 | * | 5/2002 | Yamamoto | H01L 21/563 257/787 |
| 6,411,353 B1 | * | 6/2002 | Yarita | G02F 1/133308 349/150 |
| 6,512,504 B1 | * | 1/2003 | Yamauchi | H01L 27/1251 345/87 |
| 6,621,547 B2 | * | 9/2003 | Kang | 349/151 |
| 6,664,942 B1 | * | 12/2003 | Kim | G02F 1/13452 345/204 |
| 6,670,944 B1 | * | 12/2003 | Ishii | 345/100 |
| 6,678,028 B2 | * | 1/2004 | Yamate | G02F 1/1345 257/737 |
| 6,741,297 B2 | * | 5/2004 | Moon | G02F 1/1345 349/37 |
| 6,771,248 B2 | * | 8/2004 | Tanaka | G02F 1/13452 345/100 |
| 6,870,590 B2 | * | 3/2005 | Shoji | G02F 1/13452 349/149 |
| 6,992,745 B2 | * | 1/2006 | Kim | G02F 1/1345 345/87 |
| 7,224,425 B2 | * | 5/2007 | Yu | G02F 1/13452 349/149 |
| 7,804,573 B2 | * | 9/2010 | Higuchi | G02F 1/1345 349/149 |
| 2002/0000961 A1 | * | 1/2002 | Kang | 345/87 |
| 2002/0015127 A1 | * | 2/2002 | Hagiwara | 349/149 |
| 2002/0041355 A1 | * | 4/2002 | Yamazaki | G02F 1/13452 349/149 |
| 2002/0054004 A1 | * | 5/2002 | Moon | G02F 1/1345 345/87 |
| 2002/0080318 A1 | * | 6/2002 | Yamate et al. | 349/149 |
| 2002/0140654 A1 | * | 10/2002 | Kim et al. | 345/87 |
| 2002/0140662 A1 | * | 10/2002 | Igarashi | G09G 5/005 345/98 |
| 2002/0149323 A1 | * | 10/2002 | Ito | 315/169.3 |
| 2003/0103027 A1 | * | 6/2003 | Kim et al. | 345/87 |
| 2003/0103184 A1 | * | 6/2003 | Nishino | G02F 1/1345 349/149 |
| 2003/0117352 A1 | * | 6/2003 | Kimura | G09G 3/3233 345/87 |
| 2003/0117567 A1 | * | 6/2003 | Jung | G02F 1/13452 349/149 |
| 2003/0214734 A1 | * | 11/2003 | Nishioka | G02B 7/102 359/846 |
| 2003/0227594 A1 | * | 12/2003 | Hirakata | G02F 1/1339 349/153 |
| 2004/0046909 A1 | * | 3/2004 | Sekiguchi | 349/113 |
| 2004/0046917 A1 | * | 3/2004 | Nakayoshi et al. | 349/141 |
| 2004/0145695 A1 | * | 7/2004 | Kurahashi et al. | 349/141 |
| 2004/0174487 A1 | * | 9/2004 | Yamazaki | G02F 1/13452 349/150 |
| 2004/0189926 A1 | * | 9/2004 | Yamaji | G02F 1/13452 349/149 |
| 2004/0207018 A1 | * | 10/2004 | Jang et al. | 257/347 |
| 2004/0246427 A1 | * | 12/2004 | Iwanaga et al. | 349/149 |
| 2004/0263758 A1 | * | 12/2004 | Lee | G02F 1/1345 349/150 |
| 2005/0024571 A1 | * | 2/2005 | Nakayoshi et al. | 349/141 |
| 2005/0052381 A1 | * | 3/2005 | Lee | G02F 1/1345 345/87 |
| 2005/0052442 A1 | * | 3/2005 | Takenaka | G02F 1/13452 345/204 |
| 2005/0057580 A1 | * | 3/2005 | Yamano | G09G 3/3241 345/690 |
| 2005/0130391 A1 | * | 6/2005 | Takayama | H01L 21/2007 438/458 |
| 2005/0174526 A1 | * | 8/2005 | Yu | G02F 1/13452 349/187 |
| 2005/0180083 A1 | * | 8/2005 | Takahara | G09G 3/006 361/152 |
| 2005/0253150 A1 | * | 11/2005 | Motoshima | G02F 1/1345 257/72 |
| 2005/0253993 A1 | * | 11/2005 | Chen | G02F 1/13452 349/152 |
| 2006/0115942 A1 | * | 6/2006 | Okamoto | C23F 1/20 438/197 |
| 2006/0181657 A1 | * | 8/2006 | Ueda | G02F 1/1309 349/54 |
| 2007/0181246 A1 | * | 8/2007 | Yamashita | G02F 1/133305 156/235 |

\* cited by examiner

SECOND DIRECTION
FIRST DIRECTION

SECOND DIRECTION
FIRST DIRECTION

DISPLAY APPARATUS

CROSS REFERENCE TO RELATED APPLICATION

This application is a continuation application of U.S. application Ser. No. 11/159,098 filed on Jun. 23, 2005, which claims priority to Korean Patent Application No. 10-2004-0046930, filed on Jun. 23, 2004, and all the benefits accruing from 35 U.S.C. § 119, the contents of which are hereby incorporated by reference for all purposes as if fully set forth herein.

BACKGROUND OF THE INVENTION (1) Field of the Invention

The present invention relates to a display apparatus, particularly, the present invention relates to a display apparatus capable of improving an image display quality.

(2) Description of the Related Art

A display apparatus displays an image based on data of an electric signal that is processed by an information processing apparatus. The display apparatus may include a liquid crystal display (DCD), an organic light emitting display (OLED), or the like.

A liquid crystal display (LCD) apparatus displays an image using a liquid crystal, which has electronic and optical characteristics. The LCD apparatus includes a display panel assembly and a backlight assembly. The display panel assembly controls the liquid crystal. The backlight assembly supplies the display panel assembly with a light.

The display panel assembly includes a display panel, a chip on film (COF), and an anisotropic conductive film (ACF). The display panel has the liquid crystal, and a plurality of signal lines. The COF includes a plurality of signal lines transmitting a driving signal to the display panel. The signal lines of the COF and the signal lines of the display panel are coupled via the ACF film.

The ACF film includes a resin having conductive particles. The ACF film is provided between the signal lines of the COF and the signal lines of the display panel.

The ACF film is heated and compressed so that the signal lines of the COF are coupled with the signal lines of the display panel through the conductive particles of the ACF film resin.

However, when portions of the signal lines increase, the resin may not be sufficiently ejected from a space between the signal lines of the display panel and the signal lines of the COF and the conductive particles may not contact the signal lines. Therefore, the signal lines of the display panel may be disconnected from the signal lines of the COF.

SUMMARY OF THE INVENTION

The present invention provides a display apparatus capable of improving an image display quality.

Additional features of the invention will be set forth in the description which follows, and in part will be apparent from the description, or may be learned by practice of the invention.

The present invention discloses a display apparatus including a display panel including a pixel and a plurality of first signal lines transmitting a driving signal to the pixel electrode, a conductive member on the first signal lines, the conductive member having a resin, and a second signal line on the conductive member, the second signal line having an opening through which the resin travels to couple the second signal line with one of the first signal lines.

It is to be understood that both the foregoing general description and the following detailed description are exemplary and explanatory and are intended to provide further explanation of the invention as claimed

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DESCRIPTION OF THE ILLUSTRATED EMBODIMENTS

It should be understood that the exemplary embodiments of the present invention described below may be modified in many ways without departing from the inventive principles disclosed herein, and the scope of the present invention is therefore not limited to these particular following embodiments. Rather, these embodiments are provided so that this disclosure will be thorough and complete, and will convey the concept of the invention to those skilled in the art by way of example and not of limitation. The present invention is described below with reference to the accompanying drawings.

Figure 1:
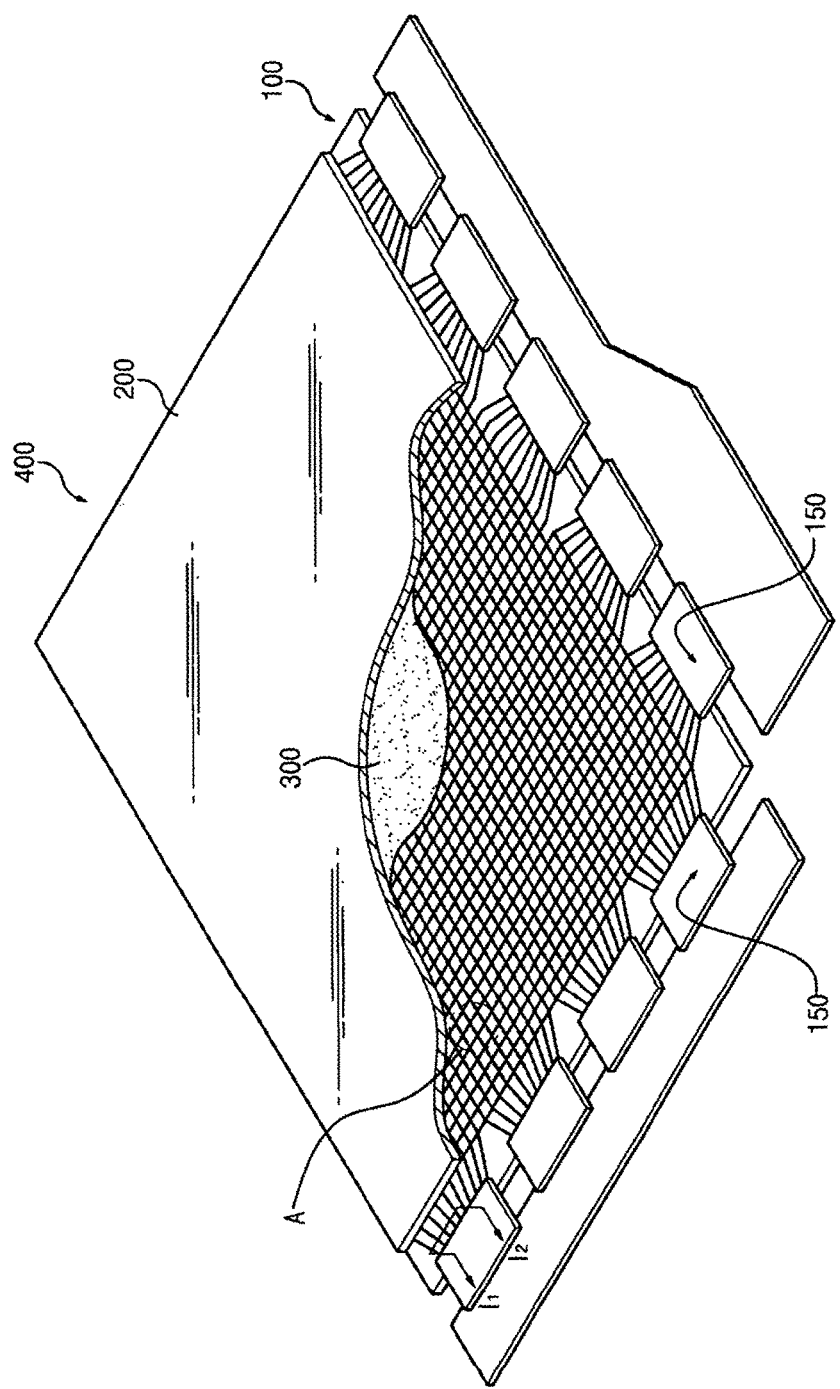
FIG. 1 is a partially cut out perspective view showing a display apparatus according to an embodiment of the invention.
Figure 2:
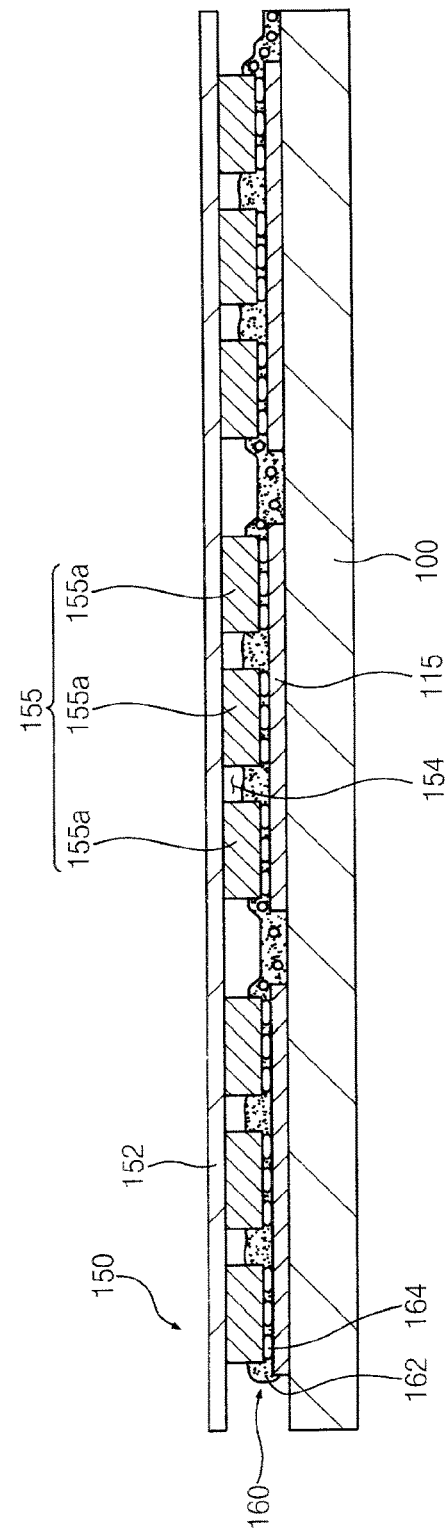
FIG. 2 is a cross-sectional view taken along a line $I_1$-$I_2$ of FIG. 1.
Figure 3:
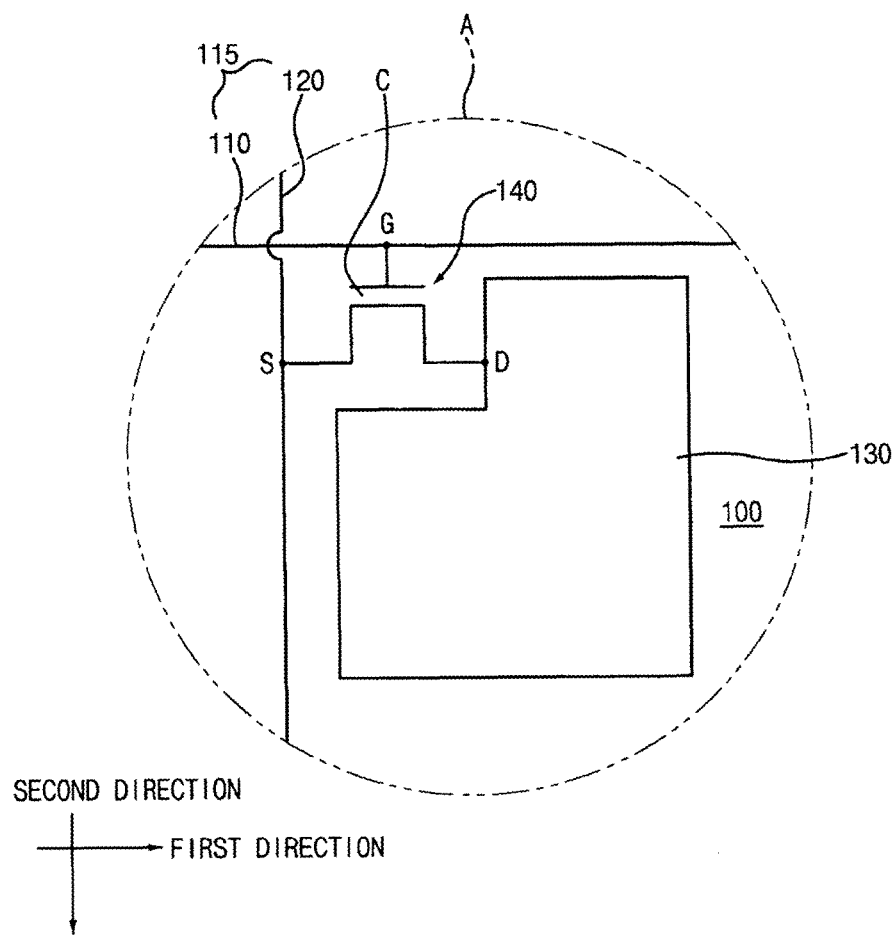
FIG. 3 is a plan view showing a portion 'A' of FIG. 1.

FIG. 1 is a partially cut out perspective view showing a display apparatus according to an embodiment of the invention. FIG. 2 is a cross-sectional view taken along a line $I_1$-$I_2$ of FIG. 1. FIG. 3 is a plan view showing a portion 'A' of FIG. 1.

Referring to FIGS. 1, 2, and 3, the display apparatus 400 includes a thin film transistor (TFT) substrate 100, a liquid crystal layer 300, and a color filter substrate 200.

The TFT substrate 100 includes first signal lines 115, a pixel electrode 130, a TFT 140, a chip on film (COF) 150, and an anisotropic conductive film (ACF) 160.

The TFT substrate 100 includes a plurality of pixel electrodes 130 that are arranged in an array or matrix shape. Each of the pixel electrodes 130 has a transparent conductive material. For example, the number of pixel electrodes 130 in the display apparatus 400 having a resolution of 1024×768 is 1024×768×3.

The first signal lines 115 may include gate signal lines 110 and data signal lines 120. The first signal lines 115 may have different areas from one another. One of the first signal lines 115 has a first area. The gate signal lines 110 are extended in a first direction. When the display apparatus 400 has the resolution of 1024×768, the display apparatus 400 includes 768 gate lines 110 that are arranged in a second direction that is substantially perpendicular to the first direction.

The data signal lines 120 are insulated from the gate signal lines 110, and extend in the second direction. For example, when the display apparatus 400 has the resolution of 1024×768, the display apparatus 400 includes 1024×3 data signal lines 120 arranged in the first direction.

The TFT 140 is adjacent to a region where each of the gate signal lines 110 crosses each of the data signal lines 120. The TFT 140 may include a gate electrode G, a channel layer C, a source electrode S and a drain electrode D. The gate electrode G is coupled with each of the gate signal lines 110. The channel layer C is provided on the gate electrode G. The channel layer C is insulated from the gate electrode G. The source electrode S is provided on the channel layer C and is coupled with each of the data signal lines 120. The drain electrode D is provided on the channel layer C and is coupled with each of the pixel electrodes 130.

The COF 150 is coupled with the first signal lines 115 and transmits a driving signal to the first signal lines 115.

The COF 150 includes a base body 152, a driving integrated circuit (not shown), and second signal lines 155. Each of the second signal lines 155 may include an ejection opening 154. When the COF 150 and the TFT substrate 100 are compressed together, a resin 162 may be ejected therebetween through the ejection opening 154.

The base body 152 may be a flexible film. The driving integrated circuit (not shown) is provided on the base body 152. The driving integrated circuit (not shown) outputs the driving signal according to an image signal to the second signal lines 155.

The ACF 160 is provided on end portions of the first signal lines 115. The ACF 160 includes the resin 162, having, for example, conductive balls 164 provided therein.

The second signal lines 155 overlap the ACF 160. The ACF 160 is heated and/or compressed between the TFT substrate 100 and the COF 150 so that the first signal lines 115 coupled with the second signal lines 155 via the conductive particles 164.

When the ACF 160 compresses, the resin 162 ejects from the space between the first signal lines 115 and the second signal lines 155.

When an area of each of the first signal lines 115 increases, which decrease an electric resistance of each of the first signal lines 115, an amount of the resin 162 remaining between the first signal lines 115 and the second signal lines 155 also increases and the first signal lines 115 disconnect from the second signal lines 155.

According to an embodiment of the invention, each of the second signal lines 155 may include an ejection opening 154 so that the resin 162 between the first and second signal lines 115 and 155 ejects through the ejection opening 154.

A second signal line 155 corresponding to the first signal line 115 is divided into a plurality of second signal line portions 155a. Each of the second signal line portions 155a has a smaller area than the area of the corresponding first signal line. The ejection opening 154 is formed between the second signal line portions 155a positioned adjacent to each other. A plurality of ejection openings may be formed between the second signal line portions 155a. For example, as shown in FIG. 2, the ejection opening 154 is substantially parallel with the second signal lines 155 so that it may rapidly eject the resin 162. Alternatively, the ejection opening 154 may be substantially parallel with a diagonal direction of each of the second signal lines 155.

When the ACF 160 between the first signal lines 115 and the second signal lines 155 is heated and compressed, the resin 162 ejects through the ejection openings 154 so that the first signal lines 115 are coupled with the second signal lines 155, respectively.

Referring again to FIG. 1, the color filter substrate 200 corresponds with the TFT substrate 100. The color filter substrate 200 includes color filters and a common electrode. The color filters of the color filter substrate 200 have same number and arrangement as the pixel electrodes 130 of the TFT substrate 100. The common electrode is provided on a surface of the color filter substrate 200 such that the common electrode corresponds with the pixel electrodes 130.

The liquid crystal layer 300 is provided between the TFT substrate 100 and the color filter substrate 200.

According to an embodiment of the invention, when the COF 150 and the TFT substrate 100 are compressed together, the resin 162 between the COF 150 and the TFT substrate 100 may eject through the ejection opening 154 so that the first signal lines 115 are coupled with the second signal lines 155, respectively.

Figure 4:
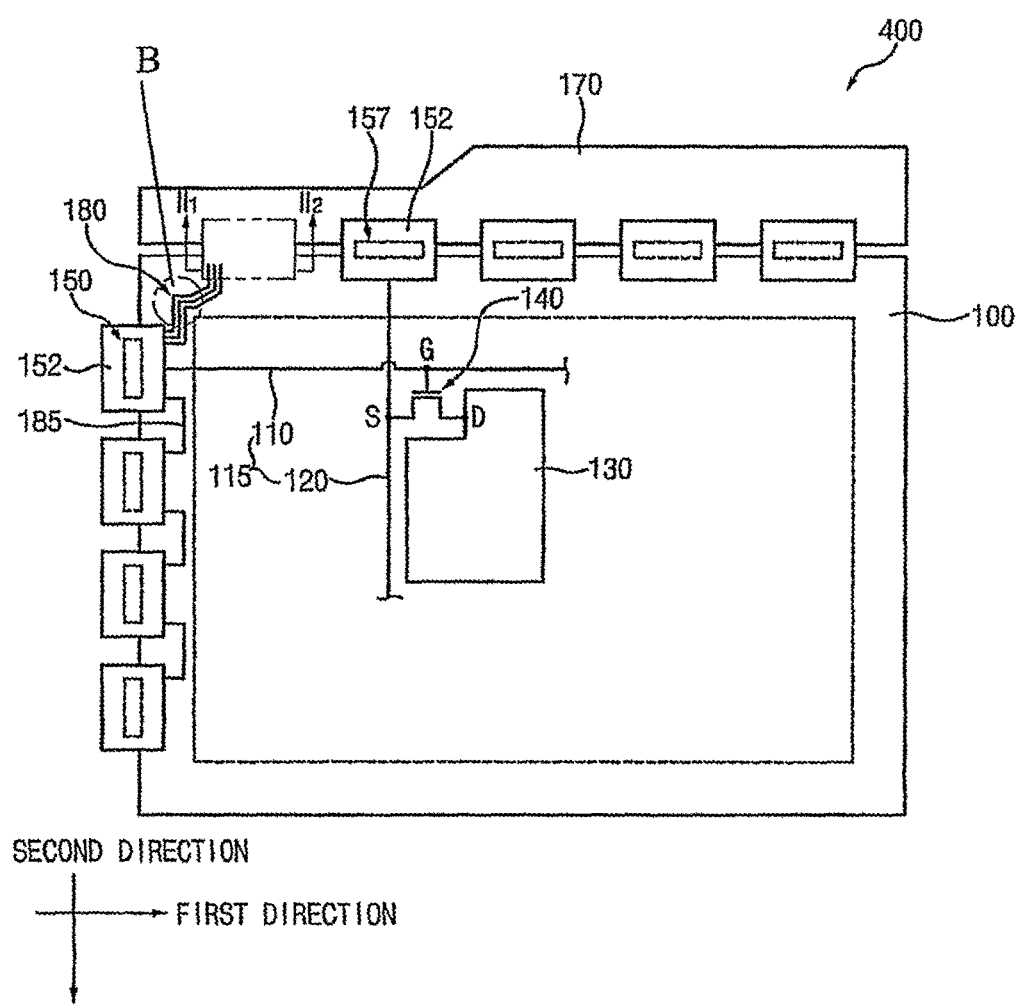
FIG. 4 is a plan view showing a display apparatus according to an embodiment of the invention.
Figure 5:
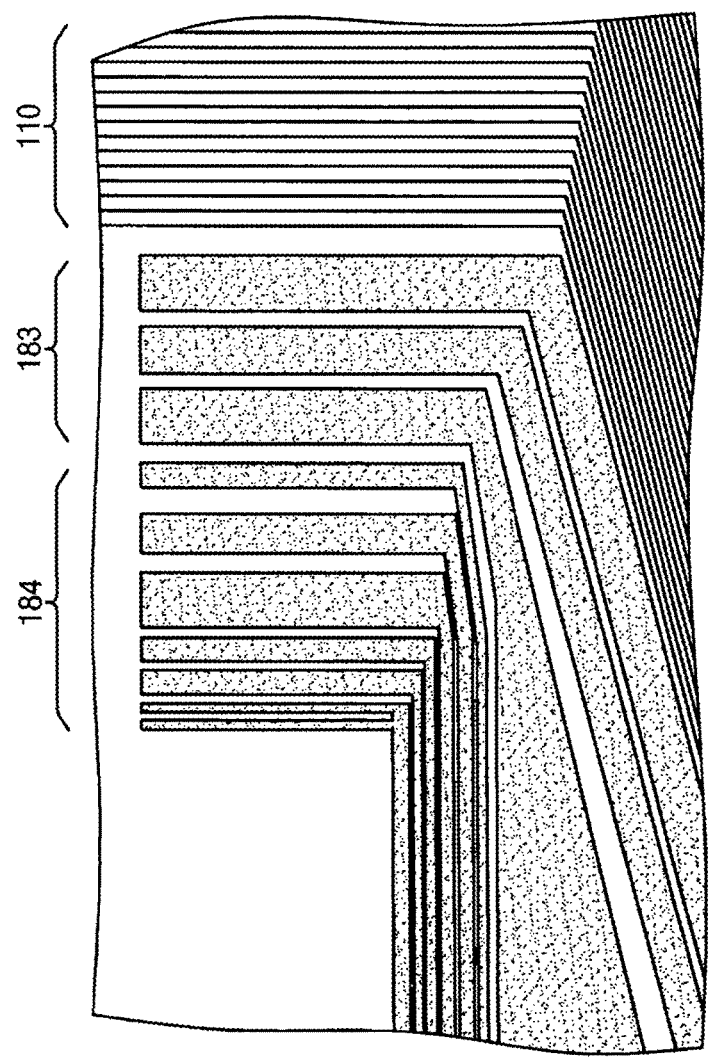
FIG. 5 is a plan view showing timing signal lines, driving signal lines, and gate signal lines of FIG. 4.
Figure 6:
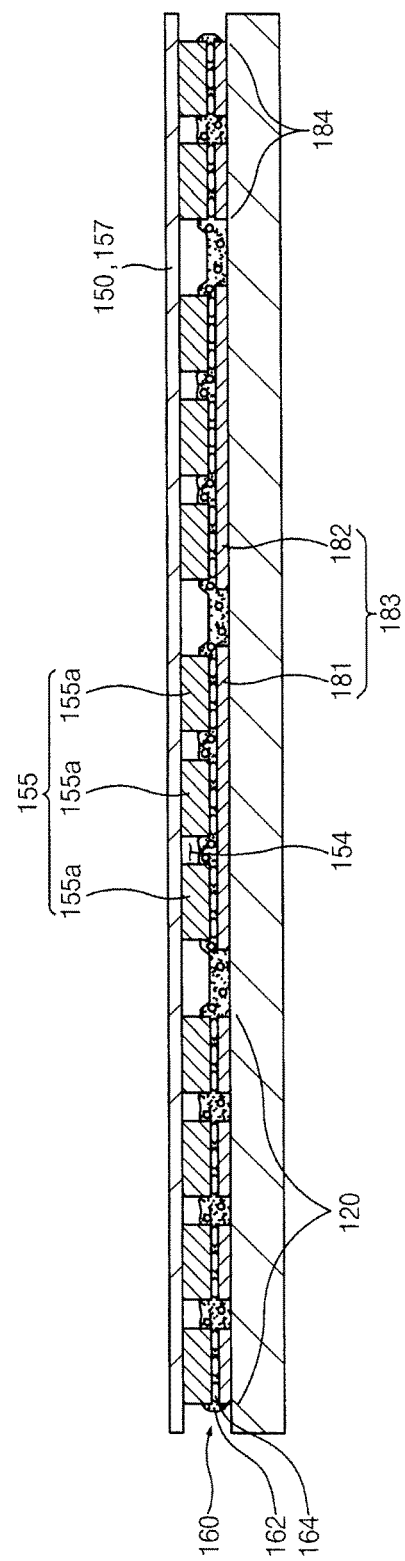
FIG. 6 is a cross-sectional view taken along a line $II_1$-$II_2$ of FIG. 4.

FIG. 4 is a plan view showing a display apparatus according to another embodiment of the invention. FIG. 5 is a plan view showing a portion 'B' of FIG. 4. FIG. 6 is a cross-sectional view taken along a line $II_1$-$II_2$ of FIG. 4. The display apparatus of FIGS. 4, 5, and 6 is same as the display apparatus in FIGS. 1, 2, and 3 except a TFT substrate. Thus, the same reference numerals will be used to refer to the same or similar parts as those described in FIGS. 1, 2, and 3, and any further explanation will be omitted as necessary.

Referring to FIGS. 4, 5, and 6, a TFT substrate 100 of the display apparatus 400 includes an integrated printed circuit board 170, first signal lines 115, a TFT 140, a pixel electrode 130, first chip on films (COF) 150, second COFs 157, anisotropic conductive films (ACF) 160, and third signal lines 180. Each of the first COF 150 and the second COFs 157 includes second signal lines 155.

The TFT substrate 100 includes a plurality of pixel electrodes 130 that are arranged in an array or a matrix shape. Each of the pixel electrodes 130 is made with a transparent conductive material. For example, the number of the pixel electrodes 130 in the display apparatus 400 having a resolution of 1024×768 is 1024×768×3.

According to an embodiment of the invention, as shown in FIG. 4, the first signal lines 115 includes gate signal lines 110 and data signal lines 120.

The gate signal lines 110 are extended in a first direction. For example, when the display apparatus 400 has the resolution of 1024×768, the display apparatus 400 includes 768 gate lines 110 that are arranged in a second direction that is substantially perpendicular to the first direction.

The data signal lines 120 are insulated from the gate signal lines 110 and extend in the second direction. For example, when the display apparatus 400 has the resolution of 1024×768, the display apparatus 400 includes 1024×3 data signals 120 that are arranged in the first direction.

The TFT 140 is adjacent to a region where each of the gate signal lines 110 crosses each of the data signal lines 120. The TFT 140 may include a gate electrode G, a channel layer C, a source electrode S, and a drain electrode D. The gate electrode G is coupled to each of the gate signal lines 110. The channel layer C is provided on the gate electrode G. The channel layer C is insulated from the gate electrode G. The source electrode S is provided on the channel layer C and coupled with each of the data lines 120. The drain electrode D is provided on the channel layer C and coupled with each of the pixel electrodes 130.

The first COF 150 and the second COF 157 are coupled with the gate signal lines 110 and the data signal lines 120 and transmit a driving signal to the gate signal lines 110 and the data signal lines 120, respectively.

The first COF 150 and the second COF 157 each include a base body 152 and a driving integrated circuit (not shown).

The base body 152 may be a flexible film. The driving integrated circuit (not shown) may be provided on the base body 152. The driving integrated circuit (not shown) outputs the driving signal to the second signal lines 155 according to an image signal.

The integrated printed circuit board 170 is coupled with the second COF 157 that is electrically connected with the data signal lines 120 of the TFT substrate 100. The integrated printed circuit board 170 sends a gate driving signal and a data driving signal to the gate signal lines 110 and the data signal lines 120, respectively, according to an image signal that is externally provided to the integrated printed circuit board 170.

The integrated printed circuit board 170 outputs the data driving signal to the data signal lines 120 through the second signal lines 155 and the driving integrated circuit that is on the second COF 157. The second COF 157 is coupled with the data signal lines 120.

The TFT substrate 100 includes the third signal lines 180 to transmit the gate driving signal generated from the integrated printed circuit board 170 to the first COF 150 that is coupled with the gate signal lines 110.

The third signal lines 180 are provided on the TFT substrate 100 and spaced apart from the gate lines 110 and the data lines 120. According to an embodiment of the invention, as shown in FIG. 6, the third signal lines 180 are provided adjacent to a corner area of the TFT substrate 100 between the first COF 150 and the second COF 157. The third signal lines 180 include driving voltage lines 183 and timing signal lines 184.

The driving voltage lines 183 include a gate turn-on signal line 181 and a gate turn-off signal line 182. A turn-on signal ($V_{on}$) is applied to the gate electrode G via the gate turn-on signal line 181 to turn on the TFT 140. A turn-off signal ($V_{off}$) is applied to the gate electrode G via the gate turn-off signal line 182 to turn off the TFT 140.

A timing signal may be applied to the timing signal lines 184 to control the turn on signal ($V_{on}$) and the turn-off signal ($V_{off}$) that are applied to the gate lines 110.

A voltage applied to the driving voltage line 183 has a high level, e.g., a high voltage; and the driving voltage line 183 is sufficiently sized so as to decrease an electric resistance of the driving voltage line 183. A voltage that is applied to the timing signal line 184 is lower than a voltage that is applied to the driving voltage line 183, therefore, an area of timing signal line 184 is smaller than an area of the driving voltage line 183.

End portions of the third signal lines 180 are coupled with the second signal lines 155 of one of the second COFs 157, which is adjacent to the first COFs 150, so that the gate driving signal is applied from the integrated printed circuit board 170 to the third signal lines 180. Remaining end portions of the third signal lines 180 are coupled with the gate signal lines 110 of one of the first COFs 150, which is adjacent to the second COFs 157. The first COFs 150 are coupled together through connecting lines 185.

The TFT substrate 110 having the first signal line 115 and the third signal line 180 coupled with the first COF 150 and the second COF 157 through the ACFs 160.

The ACFs 160 are provided on end portions of the first signal line 115 and the third signal line 180. Each of the ACFs 160 includes a resin having conductive particles.

The second signal lines 155 that are provided on the first COF 150 and the second COF 157 overlap with the ACFs 160. The ACFs 160 provided between the second signal lines 155 and the first and third signal lines 115 and 180 are heated and compressed so that the second signal lines 155 are coupled with the first signal line 115 and the third signal line 180 via the ACFs 160.

According to an embodiment of the invention, one of the first signal line 115 and the third signal line 180 has a first area. A second signal line 155 corresponding to the one of the first signal line 115 and the third signal line 180 is divided into a plurality of second signal line portions 155a. Each of the second signal line portions 155a is smaller than the one of the first signal line 115 and the third signal line 180, e.g., the second signal line portion 155a.

The ejection opening 154 may be formed between the second signal line portions 155a adjacent to each other. A plurality of ejection openings 154 may be formed between the second signal line portions 155a. For example, the ejection opening 154 may be substantially parallel with the second signal lines 155 to rapidly eject the resin 162, as is shown in FIG. 6. Alternatively, the ejection opening 154 may be substantially parallel with a diagonal direction of each of the second signal lines 155.

When the ACFs 160 provided between the first signal line 115 and the third signal line 180 of the TFT substrate 100 and the second signal line 155 of the COF 150 are heated and compressed, the resin 162 is ejected through the ejection openings 154 so that the first signal line 115 and the third signal line 180 are coupled with the second signal lines 155, respectively.

According to an embodiment of the invention, when the COF 150 and the TFT substrate 100 are compressed together, the resin 162 provided between the COF 150 and the TFT substrate 100 may eject through the ejection opening 154 so that the first signal line 115 and the third signal line 180 are coupled with the second signal line 155, respectively.

According to an embodiment of the invention, when the ACF is provided between two signal lines corresponding with each other, the resin of the ACF rapidly ejects from the space between the signal lines, thereby preventing a disconnection between the signal lines. Therefore, an image display quality of the display apparatus may be improved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display apparatus comprising:
   a display panel comprising:
   a first substrate including a plurality of first signal lines disposed spaced apart from each other, and
   a second substrate which faces the first substrate to dispose the plurality of first signal lines therebetween,
   wherein end portions of the plurality of first signal lines of the first substrate extend further than an edge of the second substrate to be elongated from the edge in a first direction, the end portions being arranged adjacent to each other in a second direction that is substantially perpendicular to the first direction; and a first film overlapping the end portions which extend further than the edge of the second substrate in the first direction, the first film comprising:
  a base, and
  a plurality of second signal lines on the base of the first film,
wherein
one second signal line of the first film is branched into a plurality of second signal line portions spaced apart from each other and arranged adjacent to each other on the base of the first film in the second direction, and
the second signal line portions of the one second signal line which are arranged adjacent to each other in the second direction overlaps a same end portion among end portions of the plurality of first signal lines of the first substrate, and are electrically connected to the same end portion.

2. The display apparatus of claim 1, wherein the first signal lines comprise:
  a gate signal line which receives a first driving signal, and
  a data signal line which receives a second driving signal,
  wherein the data signal line crosses the gate signal line.

3. The display apparatus of claim 2, wherein the display panel further comprises a thin film transistor adjacent to a region where the gate signal line crosses the data signal line.

4. The display apparatus of claim 1, wherein the display panel further comprises:
  a plurality of third signal lines,
  wherein the third signal lines comprise a driving voltage line, having a first area, to receive a driving voltage, and a timing signal line, having a second area that is less than the first area, to receive a timing signal.

5. The display apparatus of claim 4, wherein
the first signal lines comprise:
  a gate signal line which receives a first driving signal, and
  a data signal line which receives a second driving signal,
  wherein the data signal line crosses the gate signal line, and
the third signal lines comprise:
  a plurality of driving voltage lines,
  wherein the driving voltage lines include a gate turn-on signal line to apply a gate turn-on signal to the gate line and a gate turn-off signal line to apply a gate turn-off signal to the gate line.

6. The display apparatus of claim 1, further comprising:
a second film which includes a resin including a conductive particle and is between the first signal lines and the second signal lines.

7. The display apparatus of claim 6, wherein
the first film further includes a plurality of ejection openings respectively between adjacent second signal line portions of the one second signal line, and
a height of the resin disposed in an ejection opening is greater than a height of the resin disposed between the one first signal line and the second signal line portions.

8. The display apparatus of claim 7, wherein each of the second signal line portions has substantially the same width.

9. The display apparatus of claim 8, wherein each of the ejection openings has substantially the same width.

10. The display apparatus of claim 9, wherein the ejection openings are substantially parallel with the second signal line portions.

11. The display apparatus of claim 8, wherein the ejection openings are substantially parallel with the second signal line portions.

12. The display apparatus of claim 7, wherein each of the ejection openings has substantially the same width.

13. The display apparatus of claim 12, wherein the ejection openings are substantially parallel with the second signal line portions.

14. The display apparatus of claim 7, wherein the ejection openings are substantially parallel with the second signal line portions.

15. The display apparatus of claim 6, wherein each of the second signal line portions has substantially the same width.

16. The display apparatus of claim 15, wherein
the first film further includes a plurality of ejection openings respectively between adjacent second signal line portions of the one second signal line, and
each of the ejection openings has substantially the same width.

17. The display apparatus of claim 16, wherein the ejection openings are substantially parallel with the second signal line portions.

18. The display apparatus of claim 15, wherein
the first film further includes a plurality of ejection openings respectively between adjacent second signal line portions of the one second signal line, and
the ejection openings are substantially parallel with the second signal line portions.

19. The display apparatus of claim 6, wherein
the first film further includes a plurality of ejection openings respectively between adjacent second signal line portions of the one second signal line, and
each of the ejection openings has substantially the same width.

20. The display apparatus of claim 19, wherein the ejection openings are substantially parallel with the second signal line portions.

21. The display apparatus of claim 6, wherein
the first film further includes a plurality of ejection openings respectively between adjacent second signal line portions of the one second signal line, and
the ejection openings are substantially parallel with the second signal line portions.

22. The display apparatus of claim 6, wherein
the first film further includes a plurality of ejection openings respectively between adjacent second signal line portions of the one second signal line, and
a height of the resin disposed in an ejection opening is greater than a height of the resin disposed between the one first signal line and the second signal line portions.

23. The display apparatus of claim 22, wherein each of the second signal line portions has substantially the same width.

24. The display apparatus of claim 23, wherein a sum area of the second signal line portions is smaller than an area of the one first signal line.

25. The display apparatus of claim 24, wherein the ejection openings are substantially parallel with the second signal line portions.

26. The display apparatus of claim 23, wherein the ejection openings are substantially parallel with the second signal line portions.

27. The display apparatus of claim 22, wherein each of the ejection openings has substantially the same width.

28. The display apparatus of claim 27, wherein the ejection openings are substantially parallel with the second signal line portions.

29. The display apparatus of claim 22, wherein the ejection openings are substantially parallel with the second signal line portions.

30. The display apparatus of claim 1, wherein each of the second signal line portions has substantially the same width.

31. The display apparatus of claim 30, wherein
the first film further includes a plurality of ejection openings respectively between adjacent second signal line portions of the one second signal line, and
each of the ejection openings has substantially the same width.

32. The display apparatus of claim 31, wherein the ejection openings are substantially parallel with the second signal line portions.

33. The display apparatus of claim 30, wherein
the first film further includes a plurality of ejection openings respectively between adjacent second signal line portions of the one second signal line, and
the ejection openings are substantially parallel with the second signal line portions.

34. The display apparatus of claim 1, wherein
the first film further includes a plurality of ejection openings respectively between adjacent second signal line portions of the one second signal line, and
each of the ejection openings has substantially the same width.

35. The display apparatus of claim 34, wherein the ejection openings are substantially parallel with the second signal line portions.

36. The display apparatus of claim 1, wherein
the first film further includes a plurality of ejection openings respectively between adjacent second signal line portions of the one second signal line, and
the ejection openings are substantially parallel with the second signal line portions.

37. The display apparatus of claim 1, wherein
the first film further includes an ejection opening between adjacent second signal line portions.

38. The display apparatus of claim 1, wherein the second signal line comprises a same material as the second signal line portions.

39. The display apparatus of claim 6, wherein the second film resin including the conductive particle is spaced apart from the first film base.

* * * * *